(12) United States Patent
Lee et al.

(10) Patent No.: US 11,848,407 B2
(45) Date of Patent: Dec. 19, 2023

(54) DISPLAY DEVICE WITH ELECTRODE COMPRISING HOLES

(71) Applicant: Samsung Display Co., Ltd., Yongin-si (KR)

(72) Inventors: Gwang Teak Lee, Yongin-si (KR); Seong Sik Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 472 days.

(21) Appl. No.: 17/019,725

(22) Filed: Sep. 14, 2020

(65) Prior Publication Data
US 2021/0249575 A1 Aug. 12, 2021

(30) Foreign Application Priority Data
Feb. 12, 2020 (KR) .................. 10-2020-0017212

(51) Int. Cl.
| | |
|---|---|
| *H01L 29/205* | (2006.01) |
| *H01L 33/00* | (2010.01) |
| *H01L 33/62* | (2010.01) |
| *H01L 25/075* | (2006.01) |
| *H01L 25/16* | (2023.01) |

(52) U.S. Cl.
CPC .......... *H01L 33/62* (2013.01); *H01L 25/0753* (2013.01); *H01L 25/167* (2013.01)

(58) Field of Classification Search
CPC ... H01L 33/62; H01L 25/0753; H01L 25/167; H01L 27/3246; H01L 27/3248; H01L 27/3258; H01L 27/3262; H01L 27/3279; H01L 27/156; H01L 21/76895; H01L 25/105; H01L 33/36
See application file for complete search history.

(56) References Cited

U.S. PATENT DOCUMENTS

| | | | |
|---|---|---|---|
| 8,872,214 B2 | 10/2014 | Negishi et al. | |
| 9,112,112 B2 | 8/2015 | Do et al. | |
| 9,773,761 B2 | 9/2017 | Do | |
| 2011/0089850 A1 | 4/2011 | Shibata et al. | |
| 2015/0318328 A1* | 11/2015 | Bibl | H01L 24/82 257/89 |
| 2017/0062674 A1* | 3/2017 | Kwon | H01L 25/0753 |
| 2017/0125392 A1* | 5/2017 | Bibl | H01L 33/0008 |
| 2018/0019426 A1* | 1/2018 | Im | H01L 25/0753 |

FOREIGN PATENT DOCUMENTS

| | | |
|---|---|---|
| KR | 10-1244926 B1 | 3/2013 |
| KR | 10-1490758 B1 | 2/2015 |

* cited by examiner

*Primary Examiner* — Ismail A Muse
(74) *Attorney, Agent, or Firm* — Lewis Roca Rothgerber Christie LLP

(57) ABSTRACT

A display device includes a plurality of pixels on a substrate. Each of the pixels includes a first electrode and a second electrode spaced apart from each other on the substrate, and a plurality of light emitting elements, each including a first end portion connected to the first electrode and a second end portion connected to the second electrode. The first electrode includes a plurality of first holes adjacent to the first end portion of each of the light emitting elements.

18 Claims, 15 Drawing Sheets

DISPLAY DEVICE WITH ELECTRODE COMPRISING HOLES

CROSS-REFERENCE TO RELATED APPLICATION

This application claims priority to and the benefit of Korean Patent Application No. 10-2020-0017212, filed on Feb. 12, 2020 in the Korean Intellectual Property Office, the entire content of which is herein incorporated by reference.

BACKGROUND

1. Field

Aspects of embodiments of the present disclosure relate to a display device.

2. Description of the Related Art

Importance of a display device is increasing with development of multimedia. In response to this, various types of display devices, such as an organic light emitting diode (OLED) display device and a liquid crystal display (LCD), are being used.

The display device is a device for displaying an image, and the display device includes a display panel, such as an organic light emitting display panel or a liquid crystal display panel. A light emitting display panel may include a light emitting element. For example, a light emitting diode (LED) includes an organic light emitting diode (OLED) using an organic material as a fluorescent material and an inorganic light emitting diode using an inorganic material as a fluorescent material.

The inorganic light emitting diode using an inorganic semiconductor as a fluorescent material has durability in a high-temperature environment and has a high efficiency of blue light compared to an organic light emitting diode. In addition, in a manufacturing process, which has been pointed out as a limitation of the conventional inorganic light emitting diode element, a transfer method using a dielectrophoresis (DEP) method has been developed. Accordingly, research for the inorganic light emitting diode having excellent durability and efficiency compared to organic light emitting diodes has continued.

SUMMARY

According to an aspect of embodiments of the present disclosure, a display device capable of minimizing or reducing lighting failure of a light emitting element due to a short circuit is provided.

According to an aspect of embodiments of the present disclosure, a display device capable of preventing or reducing heat generation and a fire accident due to overload of a light emitting element is provided.

However, aspects of embodiments of the present disclosure are not limited to the above-described aspects, and other technical aspects that are not described may be clearly understood by those skilled in the art from the following description.

According to one or more embodiments, a display device includes a plurality of pixels on a substrate. Each of the pixels includes a first electrode and a second electrode spaced apart from each other on the substrate, and a plurality of light emitting elements, each including a first end portion connected to the first electrode and a second end portion connected to the second electrode. The first electrode includes a plurality of first holes adjacent to the first end portion of each of the light emitting elements.

The plurality of first holes may be arranged along an outer edge of the first end portion of the light emitting element.

The display device may further include a bank between the substrate and the first electrode, and the first hole may pass through the first electrode to expose an upper surface of the bank.

The display device may further include an insulating layer on the first electrode, and the insulating layer may be connected to the upper surface of the bank through the first hole.

The first electrode may include a first alignment electrode and a first contact electrode on the first alignment electrode, and the first contact electrode may cover the first end portion of the light emitting element.

The plurality of first holes may pass through the first alignment electrode and the first contact electrode.

The display device may further include an insulating layer between the first alignment electrode and the first contact electrode.

The second electrode may include a plurality of second holes adjacent to the second end portion of each of the light emitting elements.

The plurality of second holes may be arranged along an outer edge of the second end portion of the light emitting element.

An area of the first hole and an area of the second hole may be the same.

According to one or more embodiments, a display device includes a plurality of pixels on a substrate. Each of the pixels may include a first electrode and a second electrode spaced apart from each other on the substrate, a plurality of light emitting elements between the first electrode and the second electrode, and a first connection pattern connecting the first electrode and a light emitting element of the plurality of light emitting elements to each other. A melting point of the first connection pattern may be lower than a melting point of the first electrode.

An end of the first connection pattern may be in contact with the first electrode, and another end of the first connection pattern may be in contact with a first end portion of the light emitting element.

The first electrode and the light emitting element may be spaced apart from each other.

The first electrode may include a first alignment electrode and a first contact electrode on the first alignment electrode, an end of the first connection pattern may be in contact with the first contact electrode, and another end of the first connection pattern may be in contact with a first end portion of the light emitting element.

The second electrode may be in contact with a second end portion of the light emitting element.

The display device may further include a second connection pattern connecting the second electrode and the light emitting element to each other.

A first end portion of the light emitting element may be connected to the first connection pattern, and a second end portion of the light emitting element may be connected to the second connection pattern.

The second electrode and the light emitting element may be spaced apart from each other.

A melting point of the second connection pattern may be lower than a melting point of the second electrode.

The first connection pattern and the second connection pattern may be formed of a same material.

Further details of some example embodiments are included in the detailed description and drawings.

According to embodiments of the disclosure, since an electrode electrically connected to a light emitting element includes a plurality of holes, lighting failure of the light emitting element due to a short circuit may be minimized or reduced.

In addition, since connection patterns electrically connected to the light emitting element have a relatively low melting point, even though overload may occur in some light emitting elements, heat generation and a fire accident of the display device may be prevented or substantially prevented.

However, aspects and effects according to embodiments are not limited by those discussed above, and more various aspects and effects are included in the present specification.

BRIEF DESCRIPTION OF THE DRAWINGS

The above and other features of the disclosure will become more apparent by describing in further detail some example embodiments thereof with reference to the accompanying drawings, in which.

DETAILED DESCRIPTION

Figure 1:
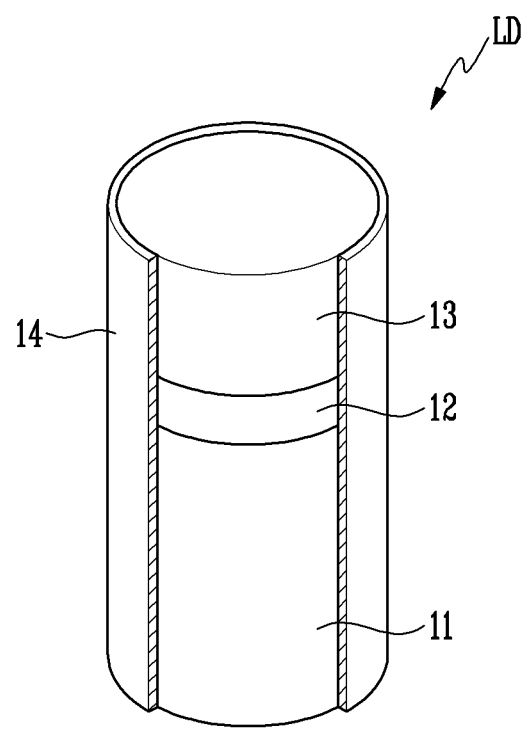
FIGS. 1 and 2 are perspective views of a light emitting element according to some embodiments.

Aspects and features of embodiments of the present disclosure and methods of achieving them will become apparent with reference to the example embodiments described in further detail below together with the accompanying drawings. However, the present disclosure is not limited to the embodiments disclosed below, and may be implemented in various different forms. The present embodiments are provided so that the disclosure will be thorough and complete and those skilled in the art to which the disclosure pertains can fully understand the scope of the disclosure. The disclosure is defined by the scope of the claims.

A case in which an element or a layer is referred to as "on" another element or layer includes a case in which another layer or another element is disposed directly on the other element or between the other layers. The same reference numerals denote the same or like components throughout the specification.

Although the terms "first," "second," and the like may be used to describe various components, these components are not limited by these terms. These terms are used to distinguish one component from another component. Therefore, a first component mentioned below may be a second component within the technical spirit of the disclosure. Singular expressions include plural expressions unless the context clearly indicates otherwise.

Herein, some embodiments of the disclosure will be described in further detail with reference to the accompanying drawings. The same or similar reference numerals are used for the same or similar components in the drawings.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
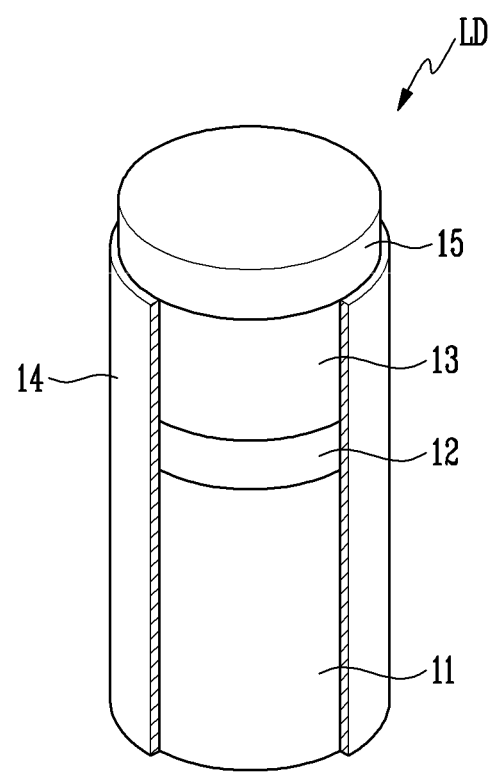

FIGS. 1 and 2 are perspective views of a light emitting element according to some embodiments.

Referring to FIGS. 1 and 2, a light emitting element LD may include a first semiconductor layer 11, a second semiconductor layer 13, and an active layer 12 interposed between the first semiconductor layer 11 and the second semiconductor layer 13. For example, the light emitting element LD may be implemented as a stack in which the first semiconductor layer 11, the active layer 12, and the second semiconductor layer 13 are sequentially stacked.

In an embodiment, the light emitting element LD may be provided in a rod shape extending along a direction. When an extension direction of the light emitting element LD is a length direction, the light emitting element LD may have a first end portion and a second end portion along the length direction. One of the first semiconductor layer 11 and the second semiconductor layer 13 may be disposed at the first end portion and the other of the first semiconductor layer 11 and the second semiconductor layer 13 may be disposed at the second end portion.

The light emitting element LD may be provided in a rod shape. Here, the term "rod" may include a rod-like shape or a bar-like shape that is long in the length direction (that is, having an aspect ratio greater than 1), such as a cylinder, a polygonal column, or the like. For example, a length of the light emitting element LD may be greater than a diameter thereof. However, the disclosure is not limited thereto. For example, the light emitting element LD may be a light emitting element having a core-shell structure.

For example, the light emitting element LD may be manufactured to have a diameter and/or a length of about a micro scale or a nano scale. For example, the diameter of the light emitting element LD may be equal to or less than 600 nm, and the length of the light emitting element LD may be equal to or less than 4 μm, but a size of the light emitting element LD is not limited thereto, and the size of the light emitting element LD may be varied according to a requirement condition of the display device to which the light emitting element LD is applied.

For example, the first semiconductor layer 11 may include at least one n-type semiconductor layer. For example, the first semiconductor layer 11 may include a semiconductor material of any of InAlGaN, GaN, AlGaN, InGaN, AlN, and InN, and may include a semiconductor layer in which a first dopant, such as Si, Ge, or Sn, is doped. However, the material configuring the first semiconductor layer 11 is not limited thereto, and the first semiconductor layer 11 may be configured of various materials.

The active layer 12 may be formed on the first semiconductor layer 11 and may be formed of a single or multi-quantum well structure. In an embodiment, when the active layer 12 includes a material of the multi-quantum well structure, the active layer 12 may be a structure in which a quantum layer and a well layer are stacked alternately with each other.

When an electric field of a certain voltage (e.g., a predetermined voltage) or more is applied to both end portions of the light emitting element LD, the light emitting element LD may emit light while an electron-hole pair is coupled in the active layer 12. By controlling the light emission of the light emitting element LD by using such a principle, the light emitting element LD may be used as a light source of various light emitting devices including a pixel of a display device.

In an embodiment, the active layer 12 may emit light having a wavelength of 400 nm to 900 nm. For example, when the active layer 12 emits light of a blue wavelength band, the active layer 12 may include a material such as AlGaN or AlGaInN. In an embodiment, when the active layer 12 is the structure in which the quantum layer and the well layer are alternately stacked in the multi-quantum well structure, the quantum layer may include a material such as AlGaN or AlGaInN, and the well layer may include a material such as GaN or AlInN. In an embodiment, the active layer 12 may include AlGaInN as the quantum layer and may include AlInN as the well layer, and, as described above, the active layer 12 may emit blue light having a central wavelength band of a range of 450 nm to 495 nm.

However, the disclosure is not limited thereto, and the active layer 12 may be a structure in which a semiconductor material of a kind of which band gap energy is large and semiconductor materials of which band gap energy is small are alternately stacked with each other, or may include Group 3 to 5 semiconductor materials which are different according to a wavelength band of emitted light. The light emitted by the active layer 12 is not limited to the light of the blue wavelength band, and, in some cases, the active layer 12 may emit light of red and green wavelength bands.

The second semiconductor layer 13 may be provided on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a semiconductor layer in which a second dopant, such as Mg, Zn, Ca, Se, or Ba, is doped, but is not limited thereto.

In the figures, the first semiconductor layer 11 and the second semiconductor layer 13 are illustrated as configured as one layer, but are not limited thereto. For example, the first semiconductor layer 11 and the second semiconductor layer 13 may be configured of a plurality of layers according to a material of the active layer 12. For example, the first semiconductor layer 11 and the second semiconductor layer 13 may further include a clad layer or a tensile strain barrier reducing (TSBR) layer.

In addition, the light emitting element LD may further include another fluorescent layer, active layer, semiconductor layer, and/or electrode layer on and/or under each layer, in addition to the above-described first semiconductor layer 11, active layer 12, and second semiconductor layer 13.

The light emitting element LD may further include at least one electrode layer disposed on an end (for example, an upper surface) side of the second semiconductor layer 13 or an end (for example, a lower surface) side of the first semiconductor layer 11. For example, the light emitting element LD may further include an electrode layer 15 disposed on an end side of the second semiconductor layer 13 as shown in FIG. 2. The electrode layer 15 may be an ohmic electrode, but is not limited thereto. For example, the electrode layer 15 may be a Schottky contact electrode. The electrode layer 15 may include a metal or a metal oxide. For example, chromium (Cr), titanium (Ti), aluminum (Al), gold (Au), nickel (Ni), indium tin oxide (ITO), indium zinc oxide (IZO), indium tin-zinc oxide (ITZO), and an oxide or an alloy thereof may be used alone or in combination, but the disclosure not limited thereto.

In addition, the light emitting element LD may further include an insulating film 14. The insulating film 14 may be omitted according to an embodiment, and may be provided so as to cover only a portion of the first semiconductor layer 11, the active layer 12, and the second semiconductor layer 13. For example, the insulating film 14 may be provided at a portion other than both end portions of the light emitting element LD, and, thus, both end portions of the light emitting element LD may be exposed.

For convenience of description, FIGS. 1 and 2 show a state in which a portion of the insulating film 14 is removed; however, all sides of the light emitting element LD may be surrounded by the insulating film 14.

The insulating film 14 may include a transparent insulating material. For example, the insulating film 14 may include at least one insulating material among $SiO_2$, $Si_3N_4$, $Al_2O_3$, and $TiO_2$, but is not limited thereto. Various materials having an insulating property may be used.

The insulating film 14 may prevent an electrical short circuit that may occur when the active layer 12 contacts a conductive material other than the first semiconductor layer 11 and the second semiconductor layer 13. In addition, by forming the insulating film 14, a surface defect of the light emitting element LD may be minimized or reduced, thereby improving a life and efficiency of the light emitting element LD.

Figure 3:
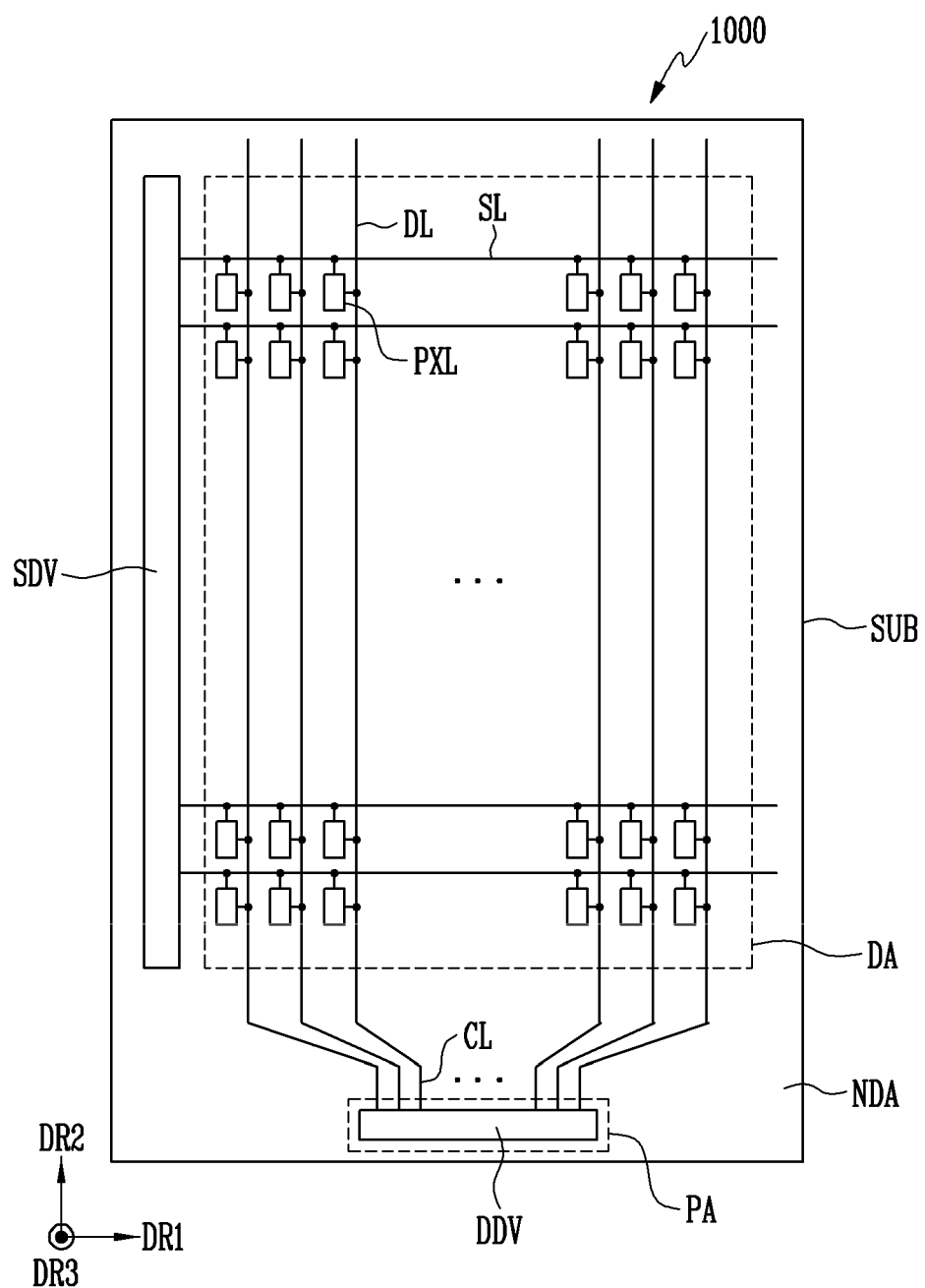
FIG. 3 is a plan view illustrating a display device according to an embodiment.

FIG. 3 is a plan view illustrating a display device according to an embodiment.

Referring to FIG. 3, a display device 1000 may include a substrate SUB and a plurality of pixels PXL provided on the substrate SUB. The display device 1000 (or the substrate SUB) may include a display area DA in which an image is displayed and a non-display area NDA except for the display area DA.

The display area DA may be an area where the pixels PXL are provided.

The non-display area NDA may be an area where drivers SDV and DDV for driving the pixels PXL, and various lines DL, SL, and CL connecting the pixels PXL and the drivers to each other are provided.

The display area DA may have any of various shapes. For example, the display area DA may be provided as any of various shapes, such as a polygon including a side formed of a straight line, a circle, an ellipse, or the like including a side formed of a curved line, or a semicircle or a semi-ellipse including a side formed of a straight line and a curved line.

When the display area DA includes a plurality of areas, each area may also be provided as any of various shapes, such as a polygon of a closed shape including a side formed of a straight line, and a circle, an ellipse, or the like including a side formed of a curved line. In addition, the areas of the plurality of areas may be the same or different from each other. In an embodiment, a case in which the display area DA is provided as one area shaped as a quadrangle including a side of a straight line will be described as an example.

The non-display area NDA may be provided on at least one side of the display area DA. In an embodiment, the non-display area NDA may surround the display area DA.

The pixels PXL may be provided in the display area DA on the substrate SUB. Each of the pixels PXL may include at least one light emitting element LD connected to a scan line SL and a data line DL and driven by a corresponding scan signal and data signal.

Each of the pixels PXL may emit one of red, green, and blue, but is not limited thereto. For example, each of the pixels PXL may emit one of cyan, magenta, yellow, and white.

The pixels PXL may include a first pixel that emits light of a first color, a second pixel that emits light of a second color different from the first color, and a third pixel that emits light of a third color different from the first color and the second color. The at least one first pixel, second pixel, and third pixel disposed to be adjacent to each other may configure one pixel unit capable of emitting light of various colors. For example, the first pixel may be a red pixel emitting red light, the second pixel may be a green pixel emitting green light, and the third pixel may be a blue pixel emitting blue light. In addition, each of the pixels PXL may include light emitting elements that emit light of the same color, and may include light conversion layers of different colors disposed on each of the light emitting elements to emit light of different colors. In another embodiment, each of the pixels PXL may include light emitting elements that emit light of different colors. However, the color, type, number, and/or the like of the pixels PXL are not particularly limited.

A plurality of pixels PXL may be provided and arranged along a first direction DR1 and a second direction DR2 crossing the first direction DR1. However, an arrangement form of the pixels PXL is not limited thereto, and may be arranged in various forms.

The drivers SDV and DDV may be disposed in the non-display area NDA. The drivers SDV and DDV may provide a signal to each of the pixels PXL through the lines SL and DL, thereby controlling driving of each of the pixels PXL. The drivers SDV and DDV may include a scan driver SDV that provides a scan signal to the pixels PXL through scan lines SL, and a data driver DDV that provides a data signal to the pixels PXL through data lines DL.

The scan driver SDV may be disposed on a side of the substrate SUB and may be disposed along a direction (for example, the second direction DR2). The scan driver SDV may be mounted on the substrate SUB as a separate component, but is not limited thereto. For example, the scan driver SDV may be formed directly on the substrate SUB. In an embodiment, the scan driver SDV may be positioned outside the substrate SUB and connected to each of the pixels PXL through a separate connection member.

The data driver DDV may be connected to each of the pixels PXL through a pad unit PA, and may provide the data signal to the pixels PXL. The pad unit PA may be disposed in the non-display area NDA, and may include a plurality of pads to be connected to the data driver DDV. The data lines DL for supplying the data signal to each of the pixels PXL may be connected to the data driver DDV through connection lines CL. The data driver DDV may be disposed directly on the pad unit PA or may be connected to the pad unit PA through a separate connection member.

According to an embodiment, the display device 1000 may further include a timing controller that controls the scan driver SDV and the data driver DDV, and an emission driver that provides an emission control signal to the pixels PXL through an emission control line.

Figure 4:
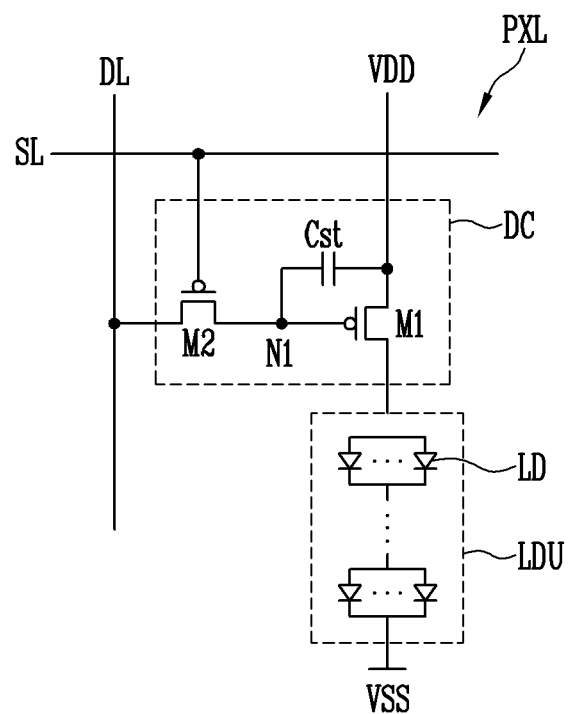
FIGS. 4 to 6 are circuit diagrams illustrating a pixel according to some embodiments.
Figure 5:
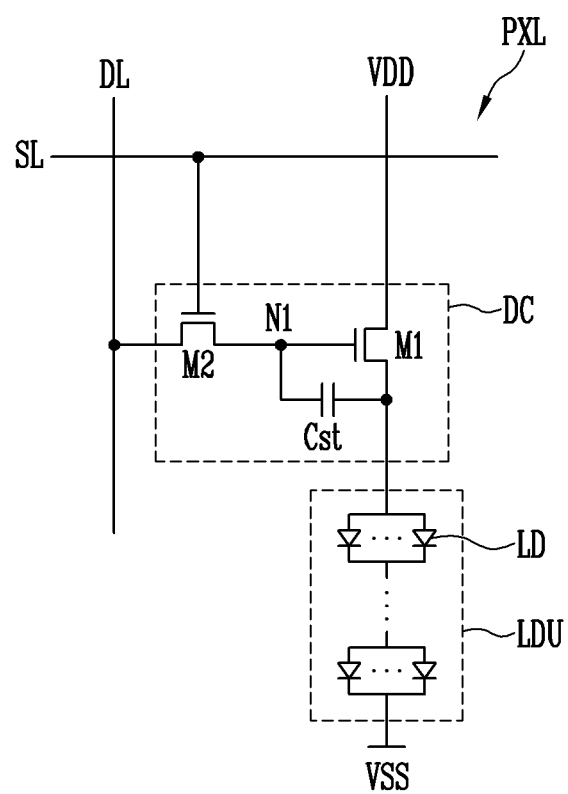
Figure 6:
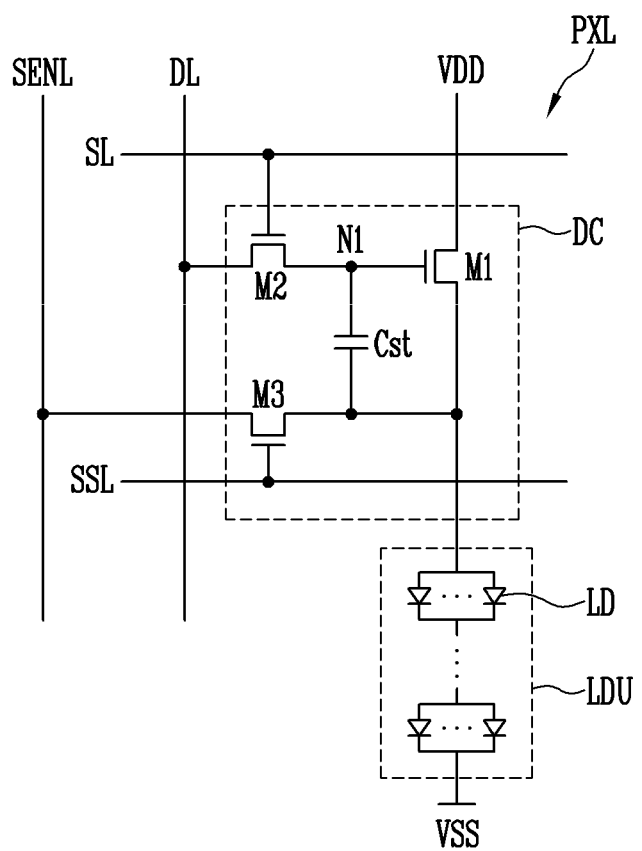

FIGS. 4 to 6 are circuit diagrams illustrating a pixel according to some embodiments. FIGS. 4 to 6 show an example of the pixel configuring an active light emitting display panel, but the disclosure is not limited thereto.

Referring to FIG. 4, the pixel PXL may include a light emitting element unit LDU including at least one light emitting element LD, and a driving circuit DC connected to the light emitting element unit LDU to drive the light emitting element LD. The light emitting element unit LDU may include a plurality of light emitting elements LD connected in parallel and/or in series with each other.

A first electrode (for example, an anode electrode) of the light emitting element LD may be connected to a first driving power source VDD through the driving circuit DC, and a second electrode (for example, a cathode electrode) of the light emitting element LD may be connected to a second driving power source VSS.

The first driving power source VDD and the second driving power source VSS may have different potentials. For example, the second driving power source VSS may have a potential equal to or lower than a potential of the first driving power source VDD by a threshold voltage or more of the light emitting element LD. That is, a voltage applied to the first driving power source VDD may be greater than a voltage applied to the second driving power source VSS.

The light emitting element LD may emit light at a luminance corresponding to a driving current controlled by the driving circuit DC.

The driving circuit DC may include a first transistor M1 (a driving transistor), a second transistor M2 (a switching transistor), and a storage capacitor Cst.

A first electrode of the first transistor M1 may be connected to the first driving power source VDD, and a second electrode of the first transistor M1 may be electrically connected to the first electrode (for example, the anode electrode) of the light emitting element LD. A gate electrode of the first transistor M1 may be connected to a first node N1. The first transistor M1 may control an amount of a driving current supplied to the light emitting elements LD in correspondence with a voltage of the first node N1.

A first electrode of the second transistor M2 may be connected to the data line DL, and a second electrode of the second transistor M2 may be connected to the first node N1. Here, the first electrode and the second electrode of the second transistor M2 may be different electrodes, and, for example, when the first electrode is a source electrode, the second electrode may be a drain electrode. A gate electrode of the second transistor M2 may be connected to the scan line SL.

The second transistor M2 may be turned on when a scan signal of a voltage (for example, a gate on voltage) at which the first transistor M1 may be turned on is supplied from the scan line SL, to electrically connect the data line DL and the first node N1 to each other. At this time, a data signal of a corresponding frame may be supplied to the data line DL, and, thus, the data signal may be transferred to the first node N1. The data signal transferred to the first node N1 may be stored in the storage capacitor Cst.

One electrode of the storage capacitor Cst may be connected to the first driving power source VDD, and another electrode of the storage capacitor Cst may be connected to the first node N1. The storage capacitor Cst may be charged with a voltage corresponding to the data signal and a voltage difference between both ends of the first driving power source VDD and may maintain the charged voltage until the data signal of a next frame is supplied.

For convenience of description, FIG. 4 shows the driving circuit DC of a relatively simple structure, which includes the second transistor M2 for transferring the data signal into each of the pixels PXL, the storage capacitor Cst for storing the data signal, and the first transistor M1 for supplying the driving current corresponding to the data signal to the light emitting element LD. However, a structure of the driving circuit DC may be variously modified. For example, the driving circuit DC may further include other circuit elements, such as various transistors such as a compensation transistor for compensating for a threshold voltage of the first transistor M1, an initialization transistor for initializing the first node N1, and/or an emission control transistor for controlling an emission time of the light emitting element LD, and a boosting capacitor for boosting the voltage of the first node N1.

In an embodiment, in FIG. 4, all of the transistors included in the driving circuit DC, for example, the first and second transistors M1 and M2 are P-type transistors, but the disclosure is not limited thereto. That is, at least one of the first and second transistors M1 and M2 included in the driving circuit DC may be an N-type transistor.

For example, as shown in FIG. 5, the first and second transistors M1 and M2 of the driving circuit DC may be implemented as N-type transistors. A driving circuit DC shown in FIG. 5 may have a configuration or operation similar to that of the driving circuit DC of FIG. 4 except for a connection position of some components due to a difference in transistor type. Therefore, further detailed description thereof will be omitted.

As another example, as shown in FIG. 6, the pixel PXL may further include a third transistor M3 (sensing transistor).

A gate electrode of the third transistor M3 may be connected to a sensing signal line SSL. One electrode of the third transistor M3 may be connected to a sensing line SENL, and another electrode of the third transistor M3 may be connected to the anode electrode of the light emitting element LD. The third transistor M3 may transfer a voltage value at the anode electrode of the light emitting element LD to the sensing line SENL according to a sensing signal supplied to the sensing signal line SSL during a sensing period. The voltage value transferred through the sensing line SENL may be provided to an external circuit (for example, the timing controller), and the external circuit may extract characteristic information (for example, the threshold voltage or the like of the first transistor M1) of the pixel PXL, based on the provided voltage value. The extracted characteristic information may be used to convert image data such that a characteristic deviation of the pixel PXL is compensated.

Figure 7:
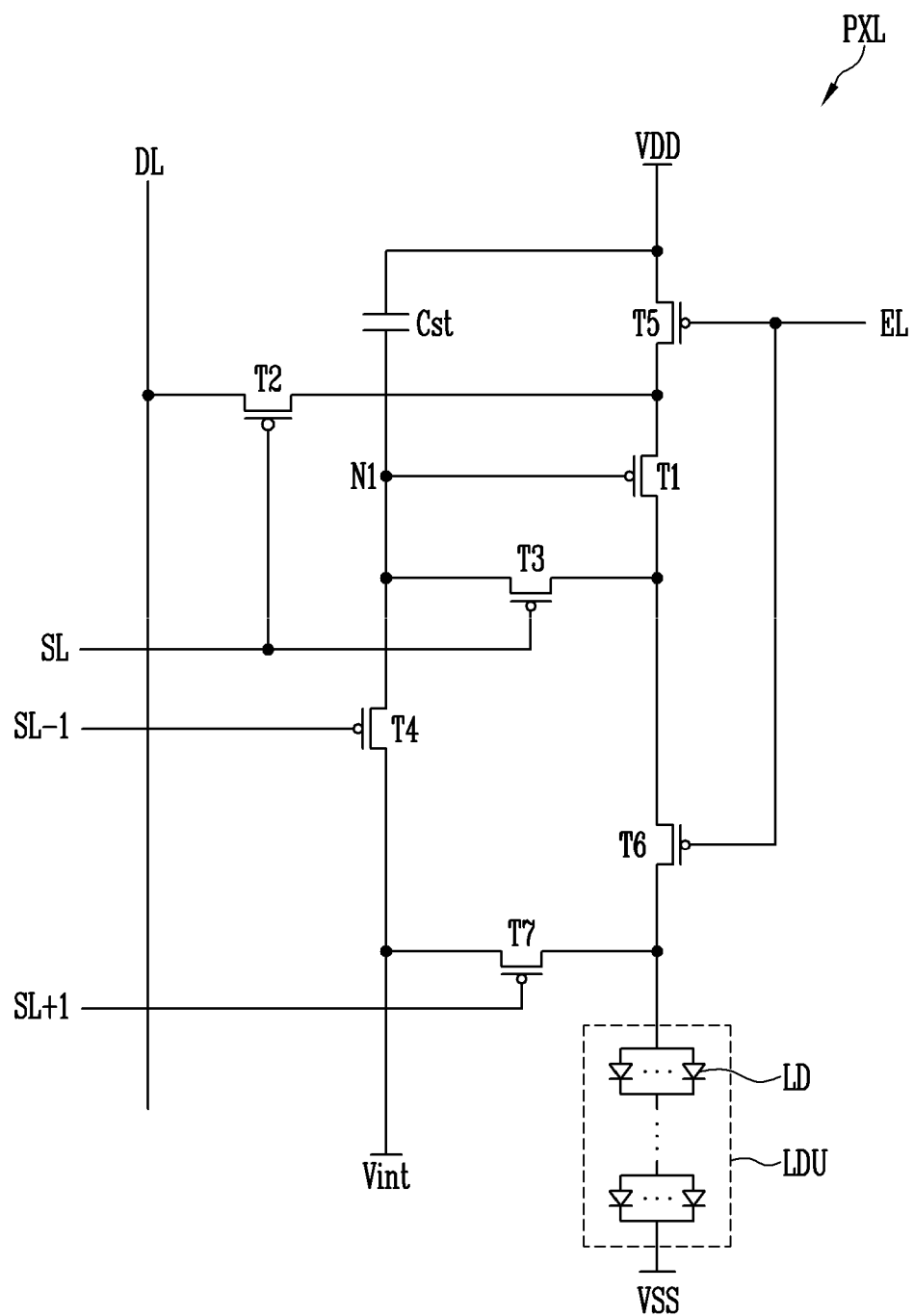
FIG. 7 is a circuit diagram illustrating a pixel according to another embodiment.

FIG. 7 is a circuit diagram illustrating a pixel according to another embodiment.

Referring to FIG. 7, the pixel PXL may include a light emitting element unit LDU, first to seventh transistors T1, T2, T3, T4, T5, T6, and T7, and a storage capacitor Cst.

The light emitting element unit LDU may include a plurality of light emitting elements LD connected in parallel and/or in series with each other. A first electrode (for example, an anode electrode) of the light emitting element LD may be connected to the first transistor T1 through the sixth transistor T6, and a second electrode (for example, a cathode electrode) of the light emitting element LD may be connected to the second driving power source VSS. The light emitting element LD may emit light at a certain luminance (e.g., a predetermined luminance) corresponding to an amount of current supplied from the first transistor T1.

One electrode of the first transistor T1 (driving transistor) may be connected to the first driving power source VDD through the fifth transistor T5, and another electrode of the first transistor T1 may be connected to the first electrode of the light emitting element LD through the sixth transistor T6. The first transistor T1 may control an amount of current flowing from the first driving power source VDD to the second driving power source VSS through the light emitting element LD, in correspondence with a voltage of the first node N1 that is a gate electrode thereof.

The second transistor T2 (switching transistor) may be connected between the data line DL and the one electrode of the first transistor T1. In addition, a gate electrode of the second transistor T2 may be connected to the scan line SL. The second transistor T2 may be turned on when a scan signal of a gate on voltage is supplied to the scan line SL, to electrically connect the data line DL and the one electrode of the first transistor T1 to each other.

The third transistor T3 may be connected between the other electrode of the first transistor T1 and the first node N1. In addition, a gate electrode of the third transistor T3 may be connected to the scan line SL. The third transistor T3 may be turned on when the scan signal of the gate on voltage is supplied to the scan line SL, to electrically connect the other electrode of the first transistor T1 and the first node N1 to each other.

The fourth transistor T4 may be connected between the first node N1 and an initialization power source Vint. In addition, a gate electrode of the fourth transistor T4 may be connected to a previous scan line SL-1. The fourth transistor T4 may be turned on when the scan signal of the gate on voltage is supplied to the previous scan line SL-1, to supply a voltage of the initialization power source Vint to the first node N1. Here, the initialization power source Vint may be set to a voltage lower than that of the data signal.

The fifth transistor T5 may be connected between the first driving power source VDD and the one electrode of the first transistor T1. A gate electrode of the fifth transistor T5 may be connected to an emission control line EL. The fifth transistor T5 may be turned on when an emission control signal of a gate on voltage is supplied to the emission control line EL, and may be turned off in other cases.

The sixth transistor T6 may be connected between the other electrode of the first transistor T1 and the first electrode of the light emitting element LD. A gate electrode of the sixth transistor T6 may be connected to the emission control line EL. The sixth transistor T6 may be turned on when the emission control signal of the gate on voltage is supplied to the emission control line EL, and may be turned off in other cases.

The seventh transistor T7 may be connected between the initialization power source Vint and the first electrode (for example, the anode electrode) of the light emitting element LD. In addition, a gate electrode of the seventh transistor T7 may be connected to a subsequent scan line SL+1. The seventh transistor T7 may be turned on when the scan signal of the gate on voltage is supplied to the subsequent scan line SL+1, to supply the voltage of the initialization power source Vint to the first electrode of the light emitting element LD.

FIG. 7 illustrates a case in which the gate electrode of the seventh transistor T7 is connected to the subsequent scan line SL+1. However, embodiments of the present disclosure are not limited thereto. For example, the gate electrode of the seventh transistor T7 may be connected to the scan line SL. In this case, the voltage of the initialization power source Vint may be supplied to the anode electrode of the light emitting element LD through the seventh transistor T7 when the scan signal of the gate on voltage is supplied to the scan line SL.

The storage capacitor Cst may be connected between the first driving power source VDD and the first node N1. The storage capacitor Cst may store a voltage corresponding to the data signal and the threshold voltage of the first transistor T1.

In an embodiment, in FIG. 7, all of the transistors included in the driving circuit DC, for example, the first to seventh transistors T1, T2, T3, T4, T5, T6, and T7 are P-type transistors, but embodiments of the present disclosure are not limited thereto, and at least one of the first to seventh transistors T1, T2, T3, T4, T5, T6, and T7 may be an N-type transistor.

Figure 8:
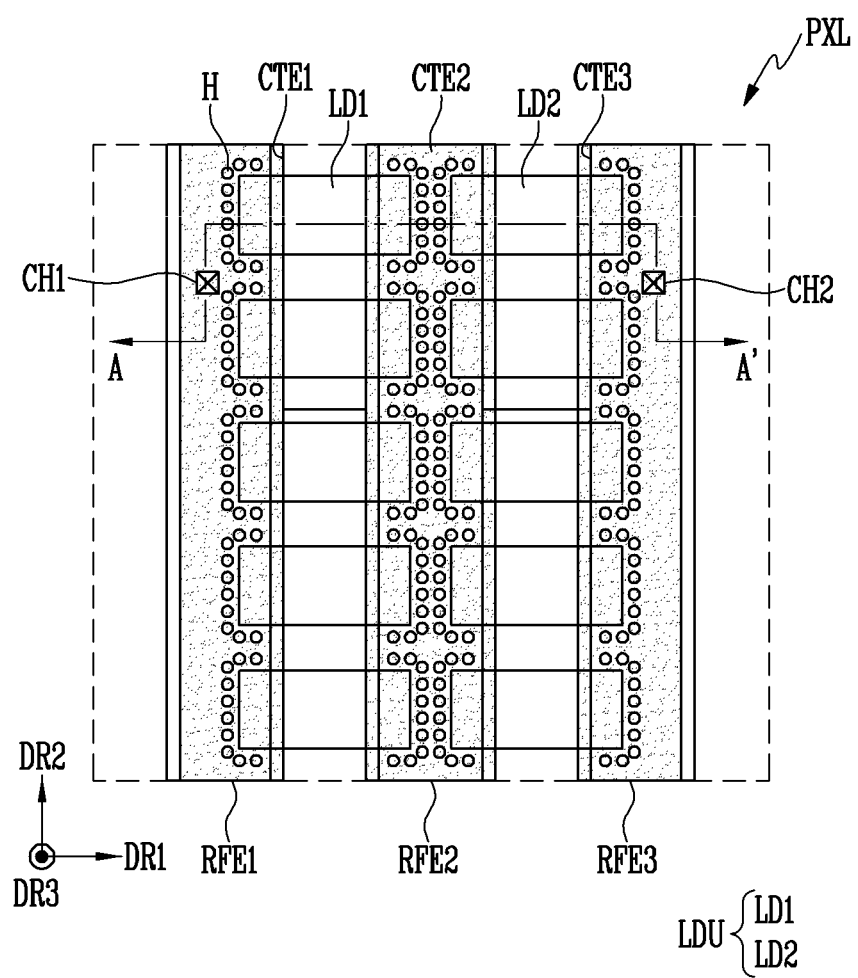
FIG. 8 is a plan view of a pixel according to an embodiment.
Figure 9:
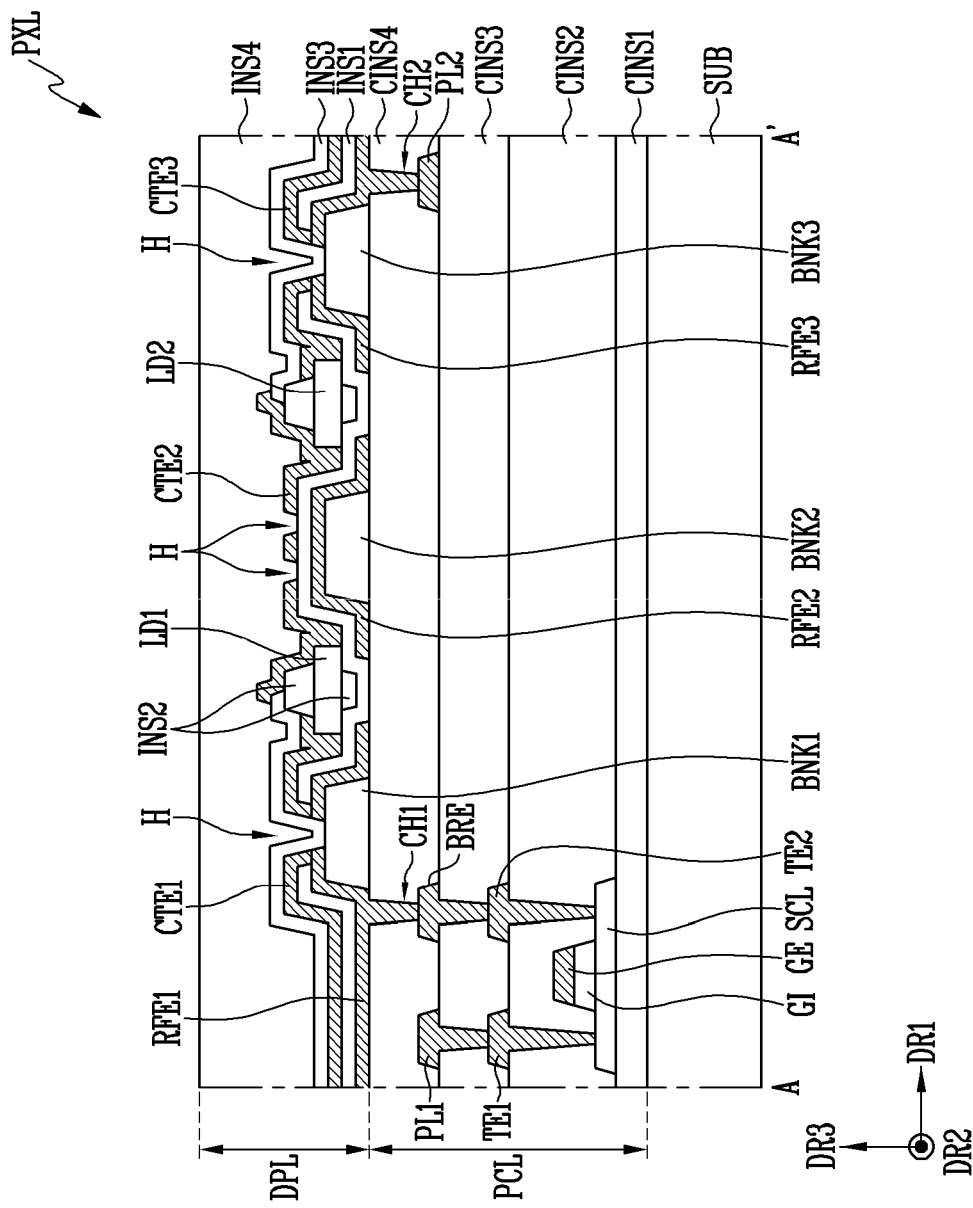
FIG. 9 is a cross-sectional view taken along the line A-A' of FIG. 8.

FIG. 8 is a plan view of a pixel according to an embodiment; and FIG. 9 is a cross-sectional view taken along the line A-A' of FIG. 8.

Referring to FIGS. 8 and 9, the display device 1000 may include a substrate SUB, a pixel circuit layer PCL, and a display layer DPL.

The substrate SUB may have a planar rectangular shape. The substrate SUB may include both short sides extending in a direction and both long sides extending in another direction crossing the direction. A corner portion where the long side and the short side of the planar substrate SUB meet may be a right angle, but is not limited thereto, and may have a rounded curved shape. The planar shape of the substrate SUB is not limited to that illustrated, but may have a square, a circle, an ellipse, or other shapes.

The substrate SUB may be a rigid substrate or a flexible substrate, and a material or a physical property thereof is not particularly limited. For example, the substrate SUB may be a rigid substrate configured of glass or tempered glass, or a flexible substrate configured of a thin film of a plastic or metal material. In addition, the substrate SUB may be a transparent substrate, but is not limited thereto. For example, the substrate SUB may be a translucent substrate, an opaque substrate, or a reflective substrate.

The pixel circuit layer PCL may be disposed on the substrate SUB. The pixel circuit layer PCL may include a plurality of circuit elements configuring the pixel driving circuit DC of FIG. 4 of the pixel PXL.

The pixel circuit layer PCL may include a first circuit insulating layer CINS1, a second circuit insulating layer CINS2, a third circuit insulating layer CINS3, and a fourth circuit insulating layer CINS4 sequentially stacked on the substrate SUB. Each of the first to fourth circuit insulating layers CINS1 to CINS4 may be insulating layers including an organic insulating material or an inorganic insulating material.

A semiconductor pattern SCL may be disposed on the first circuit insulating layer CINS1. The semiconductor pattern SCL may include a first region that is in contact with a first transistor electrode TE1, which will be described later, a second region connected to a second transistor electrode TE2, and a channel region positioned between the first region and the second region. One of the first region and the second region may be a source region and the other may be a drain region.

The semiconductor pattern SCL may be a semiconductor pattern formed of polysilicon, amorphous silicon, oxide semiconductor, or the like. In an embodiment, the channel region of the semiconductor pattern SCL may be an intrinsic semiconductor as a semiconductor pattern in which an impurity is not doped, and the first region and the second region of the semiconductor pattern SCL may be semiconductor patterns in which a predetermined impurity is doped, respectively.

A gate electrode GE may be disposed on the semiconductor pattern SCL. A gate insulating film GI may be disposed between the gate electrode GE and the semiconductor pattern SCL. The gate electrode GE and the semiconductor pattern SCL may be insulated from each other by the gate insulating film GI. In FIG. 9, a transistor of a top-gate structure in which the gate electrode GE is positioned on the semiconductor pattern SCL is illustrated, but embodiments of the present disclosure are not limited thereto. For example, the gate electrode GE may be disposed under the semiconductor pattern SCL or may be disposed on and under the semiconductor pattern SCL.

A first circuit conductive layer may be disposed on the second circuit insulating layer CINS2. The first circuit conductive layer may include a first transistor electrode TE1 and a second transistor electrode TE2. The first transistor electrode TE1 may contact the first region of the semiconductor pattern SCL described above through a contact hole passing through the second circuit insulating layer CINS2. The second transistor electrode TE2 may contact the second region of the semiconductor pattern SCL described above through a contact hole passing through the second circuit insulating layer CINS2.

A second circuit conductive layer may be disposed on the third circuit insulating layer CINS3. The second circuit conductive layer may include a first power source line PL1, a second power source line PL2, and a bridge line BRE.

The first power source line PL1 may be a line connected to the first driving power source VDD of FIG. 4. The first power source line PL1 may contact the first transistor electrode TE1 through a contact hole passing through the third circuit insulating layer CINS3.

The second power source line PL2 may be a line connected to the second driving power source VSS of FIG. 4. The second power source line PL2 may contact a third alignment electrode RFE3, which will be described later, through a second contact hole CH2 passing through the fourth circuit insulation layer CINS4.

The bridge line BRE may contact the second transistor electrode TE2 through a contact hole passing through the third circuit insulating layer CINS3. The bridge line BRE may contact a first alignment electrode RFE1, which will be described later, through a first contact hole CH1 passing through the fourth circuit insulating layer CINS4. Accordingly, a driving current provided to the second transistor electrode TE2 may be supplied to the first alignment electrode RFE1 through the bridge line BRE.

The display layer DPL may be disposed on the pixel circuit layer PCL. The display layer DPL may include a light emitting element unit LDU including a plurality of light emitting elements LD1 and LD2 connected in parallel and/or in series with each other.

The display layer DPL may include a bank layer, an alignment electrode layer, a first insulating layer INS1, the light emitting element unit LDU, a second insulating layer INS2, a contact electrode layer, a third insulating layer INS3, and a fourth insulating layer INS4.

The bank layer may include an insulating material of an organic material or an inorganic material, but is not limited thereto.

The bank layer may include a first bank BNK1, a second bank BNK2, and a third bank BNK3.

The light emitting element unit LDU may be disposed in a separation space between the first bank BNK1, the second bank BNK2, and the third bank BNK3. To this end, the first bank BNK1, the second bank BNK2, and the third bank BNK3 may be spaced apart from each other by a distance longer than lengths of the light emitting elements LD1 and LD2.

In an embodiment, each of the first bank BNK1, the second bank BNK2, and the third bank BNK3 may have a trapezoidal shape in which a side surface is inclined at an angle (e.g., a predetermined angle), but is not limited thereto, and may have any of various shapes, such as a semi-ellipse, a circle, and a quadrangle.

The alignment electrode layer may be disposed on the bank layer. The alignment electrode layer may be formed of a conductive material. The conductive material may include silver (Ag), magnesium (Mg), aluminum (Al), platinum (Pt), palladium (Pd), gold (Au), nickel (Ni), neodymium (Nd), iridium (Ir), chromium (Cr), titanium (Ti), a metal such as an alloy thereof, and the like, but is not limited thereto. For example, the alignment electrode layer may include a conductive material having a constant reflectance. In this case, light emitted from end portions of each of the light emitting elements LD1 and LD2 may be reflected by the alignment electrode layer and may progress in a display direction (for example, a third direction DR3).

In an embodiment, the alignment electrode layer may be formed as a single layer. However, embodiments of the present disclosure are not limited thereto, and the alignment electrode layer may be formed of multiple layers. For example, the alignment electrode layer may further include a capping layer (not shown) formed of a transparent conductive material. The capping layer may be disposed to cover the alignment electrode layer to prevent or substantially prevent damage of the alignment electrode layer, which may occur during a manufacturing process of the display device.

The alignment electrode layer may include the first alignment electrode RFE1, a second alignment electrode RFE2, and the third alignment electrode RFE3.

The first alignment electrode RFE1, the second alignment electrode RFE2, and the third alignment electrode RFE3 may extend along the second direction DR2. The first alignment electrode RFE1 and the second alignment electrode RFE2 may be spaced apart from each other along the first direction DR1 with the first light emitting element LD1 interposed therebetween. The second alignment electrode RFE2 and the third alignment electrode RFE3 may be spaced apart from each other along the first direction DR1 with the second light emitting element LD2 therebetween.

The first alignment electrode RFE1 may be provided on the first bank BNK1, the second alignment electrode RFE2 may be provided on the second bank BNK2, and the third alignment electrode RFE3 may be provided on the third bank BNK3. Accordingly, the first alignment electrode RFE1, the second alignment electrode RFE2, and the third alignment electrode RFE3 may have shapes corresponding to shapes of the first bank BNK1, the second bank BNK2, and the third bank BNK3, respectively. That is, the first alignment electrode RFE1, the second alignment electrode RFE2, and the third alignment electrode RFE3 may have an inclined surface having an angle (e.g., a predetermined angle) from an upper surface of the substrate SUB. In this case, the light emitted from both end portions of the light emitting elements LD1 and LD2 may be reflected by the inclined surface of the first alignment electrode RFE1, the second alignment electrode RFE2, and the third alignment electrode RFE3, and may progress in the third direction DR3. Therefore, light emission efficiency of the display device may be improved.

As described above, the first alignment electrode RFE1 may be electrically connected to the bridge line BRE of the pixel circuit layer PCL through the first contact hole CH1 passing through the fourth circuit insulation layer CINS4. In addition, the third alignment electrode RFE3 may be electrically connected to the second power source line PL2 of the pixel circuit layer PCL through the second contact hole CH2 passing through the fourth circuit insulation layer CINS4. The first alignment electrode RFE1 may receive a driving current from the bridge line BRE and supply driving current to the light emitting element unit LDU.

The first insulating layer INS1 may be provided on the alignment electrode layer. In an embodiment, the first insulating layer INS1 may be disposed on an entire surface of the substrate SUB.

The first insulating layer INS1 may be an inorganic insulating layer formed of an inorganic material. In this case, the first insulating layer INS1 may be disposed at a substantially uniform thickness along surfaces of the substrate SUB and the alignment electrode layer.

The light emitting elements LD1 and LD2 may be disposed on the first insulating layer INS1. The light emitting elements LD1 and LD2 may be disposed in spaces provided between the banks BNK1, BNK2, and BNK3, respectively. For example, the first light emitting element LD1 may be disposed in a space provided between the first bank BNK1 and the second bank BNK2, and the second light emitting element LD2 may be disposed in a space provided between the second bank BNK2 and the third bank BNK3. Each of the light emitting elements LD1 and LD2 may be connected in series and in parallel with each other, and may receive the driving current to emit light of a luminance corresponding to the driving current.

The second insulating layer INS2 may be disposed on the light emitting element unit LDU. The second insulating layer INS2 may be disposed to overlap each of the light emitting elements LD1 and LD2.

The second insulating layer INS2 may be disposed to cover at least a portion of each of the light emitting elements LD1 and LD2, and may be disposed to expose a first end portion and a second end portion of each of the light emitting elements LD1 and LD2. In an embodiment, the second insulating layer INS2 may fill a space between each of the light emitting elements LD1 and LD2 and the first insulating layer INS1. Accordingly, the light emitting elements LD1 and LD2 may be more stably disposed and fixed on the first insulating layer INS1.

The contact electrode layer may be formed on the first insulating layer INS1 and the second insulating layer INS2.

The contact electrode layer may be configured of a transparent conductive material. For example, the transparent conductive material may include indium tin oxide (ITO), indium zinc oxide (IZO), indium tin-zinc oxide (ITZO), or the like. In an embodiment, the contact electrode layer is configured of a transparent conductive material, such that when the light emitted from the light emitting elements LD1 and LD2 progresses in the third direction DR3, light loss may be reduced. However, the material of the contact electrode layer is not limited to the above-described materials.

The contact electrode layer may include a first contact electrode CTE1, a second contact electrode CTE2, and a third contact electrode CTE3. The first contact electrode CTE1 may be referred to as a first electrode together with the first alignment electrode RFE1. In addition, the second contact electrode CTE2 may be referred to as a second electrode together with the second alignment electrode RFE2.

The first contact electrode CTE1 may contact the first alignment electrode RFE1 through a contact hole passing through the first insulating layer INS1, and may receive the driving current from the first alignment electrode RFE1. An end of the contact electrode CTE1 may contact an end of the first light emitting element LD1. Accordingly, the first contact electrode CTE1 may supply the driving current provided from the first alignment electrode RFE1 to the first light emitting element LD1.

The third contact electrode CTE3 may contact the third alignment electrode RFE3 through a contact hole passing through the first insulating layer INS1, and may receive a voltage of the second power source line PL2 through the third alignment electrode RFE3. That is, the third contact electrode CTE3 may be connected to the second driving power source VSS of FIG. 4 through the second power source line PL2. An end of the third contact electrode CTE3 may contact the second end portion of the second light emitting element LD2. Accordingly, the third contact electrode CTE3 may supply the voltage of the second driving power source VSS to the second light emitting element LD2.

One end of the second contact electrode CTE2 may contact the other end of the first light emitting element LD1, and another end of the second contact electrode CTE2 may contact an end of the second light emitting element LD2. The second contact electrode CTE2 may connect the first light emitting element LD1 and the second light emitting element LD2 in series.

The first contact electrode CTE1, the second contact electrode CTE2, and/or the third contact electrode CTE3 may include a plurality of holes H passing through the first contact electrode CTE1, the second contact electrode CTE2, and/or the third contact electrode CTE3.

The plurality of holes H may be formed along both end portions of the light emitting elements LD1 and LD2.

In an embodiment, areas of the plurality of holes H may be the same (the same or substantially the same), but are not necessarily limited thereto.

In FIGS. 8 and 9, a case in which each of the plurality of holes H has a circular shape is illustrated, but embodiments of the present disclosure are not limited thereto. In an embodiment, the holes H may have a planar quadrangle or a slit shape extending in the first direction DR1 and/or the second direction DR2.

In an embodiment, the plurality of holes H may pass through the contact electrode layer, and may further pass through an electrode layer (for example, the alignment electrode layer) disposed under the contact electrode layer. In another embodiment, the plurality of holes H may pass through the contact electrode layer to expose an upper surface of an insulating layer (for example, the first insulating layer INS1) disposed under the contact electrode layer.

For example, the plurality of holes H may pass through the first contact electrode CTE1 and the first alignment electrode RFE1. Accordingly, the plurality of holes H may partially expose an upper surface of the first bank BNK1 disposed under the first alignment electrode RFE1.

In an embodiment, the plurality of holes H may pass through the second contact electrode CTE2. Accordingly, the plurality of holes H may partially expose an upper surface of the first insulating layer INS1 disposed under the second contact electrode CTE2.

In an embodiment, the plurality of holes H may pass through the third contact electrode CTE3 and the third alignment electrode RFE3. Accordingly, the plurality of holes H may partially expose an upper surface of the third bank BNK3 disposed under the third alignment electrode RFE3.

An area between the plurality of holes H may be disconnected by a momentary high current when a short circuit failure occurs. Accordingly, even though short circuit failure may occur in some light emitting elements LD1 and LD2, other light emitting elements may normally operate. For example, when the short circuit failure occurs in some light emitting elements LD1 and LD2, all of light emitting elements disposed in the same column as the light emitting element where the short circuit occurs may not emit light. Therefore, in the display device according to an embodiment, when a current of tens or more times an allowable current momentarily flows due to the short circuit failure, the area between the plurality of holes H disposed along the end portion of the light emitting element where the short circuit occurs may be disconnected. Therefore, even though the short circuit failure occurs in some light emitting elements LD1 and LD2, other light emitting elements may normally operate. That is, lighting failure of the light emitting elements LD1 and LD2 due to the short circuit may be minimized or reduced.

In the figures, a case in which all of the first contact electrode CTE1, the second contact electrode CTE2, and the third contact electrode CTE3 include the plurality of holes H is illustrated. However, according to an embodiment, only some of the contact electrodes CTE1, CTE2, and CTE3 may include the plurality of holes H. For example, only one contact electrode of the first contact electrode CTE1 and the second contact electrode CTE2 connected to the first light emitting element LD1 may include the plurality of holes H, and only one contact electrode of the second contact electrode CTE2 and the third contact electrode CTE3 connected to the second light emitting element LD2 may include the plurality of holes H.

The third insulating layer INS3 may be disposed between the first contact electrode CTE1 and the second contact electrode CTE2 and between the second contact electrode CTE2 and the third contact electrode CTE3.

A surface of the third insulating layer INS3 may contact the first contact electrode CTE1 and the third contact electrode CTE3. In an embodiment, the surface of the third insulating layer INS3 may contact the upper surfaces of the first bank BNK1 and the third bank BNK3 exposed by the plurality of holes H. Another surface of the third insulating layer INS3 may contact the second contact electrode CTE2. However, the third insulating layer INS3 may be omitted according to an embodiment.

The fourth insulating layer INS4 may be disposed on the contact electrode layer and the third insulating layer INS3. The fourth insulating layer INS4 may cover the contact electrode layer and may prevent or substantially prevent damage of the contact electrode layer. In addition, the fourth insulating layer INS4 may prevent or substantially prevent oxygen, moisture, and the like from penetrating into the light emitting elements LD1 and LD2.

The fourth insulating layer INS4 may include an inorganic insulating film formed of an inorganic material or an organic insulating film formed of an organic material. The fourth insulating layer INS4 may be formed of a single layer, but is not limited thereto. The fourth insulating layer INS4 may be formed of multiple layers including an organic insulating film and an inorganic insulating film. For example, the fourth insulating layer INS4 may further include a planarization layer. The planarization layer may alleviate a step difference generated due to various configurations disposed under the planarization layer. The planarization layer may include an organic insulating film, but is not limited thereto.

According to the above-described embodiment, when a short circuit failure occurs in some light emitting elements LD1 and LD2, the area between the plurality of holes H formed along the end portion of the corresponding light emitting element may be disconnected. Therefore, even though the short circuit failure occurs, other light emitting elements may normally operate, thereby minimizing or reducing a lighting failure of the light emitting elements.

Herein, a display device according to another embodiment of the disclosure will be described. In the following embodiments, the same components as the components already described will be referred to by the same reference numerals, and repetitive description may be omitted or simplified.

Figure 10:
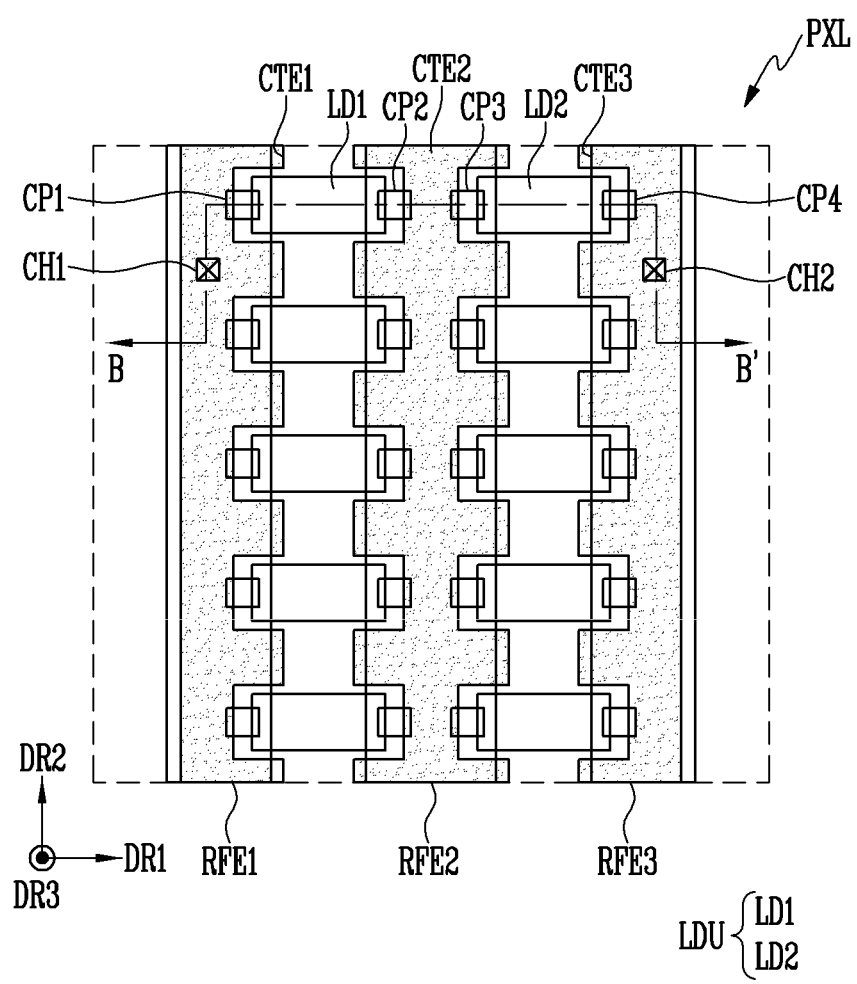
FIG. 10 is a plan view of a pixel according to another embodiment.
Figure 11:
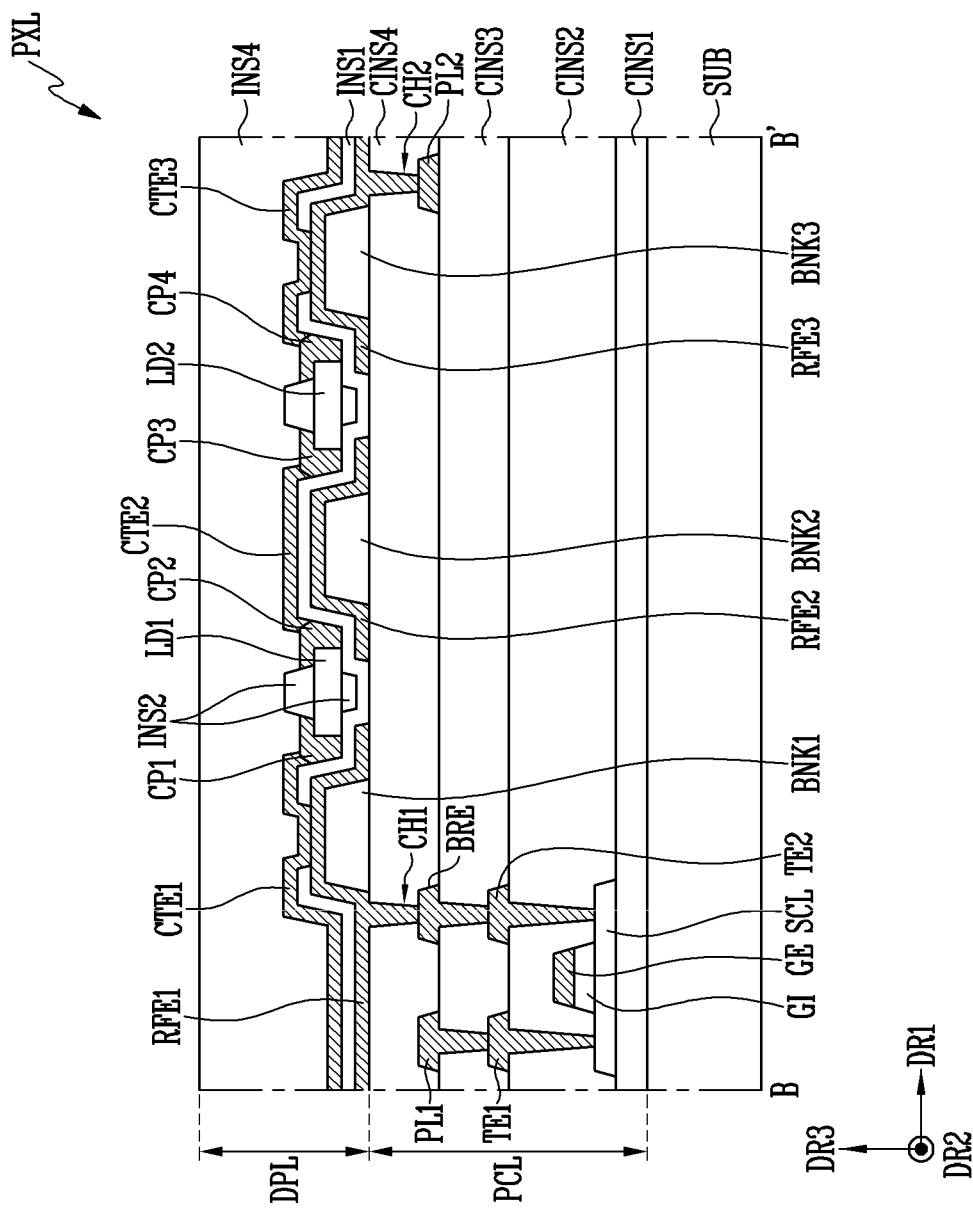
FIG. 11 is a cross-sectional view taken along the line B-B' of FIG. 10.

FIG. 10 is a plan view of a pixel according to another embodiment; and FIG. 11 is a cross-sectional view taken along the line B-B' of FIG. 10.

Referring to FIGS. 10 and 11, a display device according to another embodiment is different from the embodiment of FIGS. 1 to 9 in that the display device according to the present embodiment further includes connection patterns CP1, CP2, CP3, and CP4 contacting the end portions of the light emitting elements LD1 and LD2.

The connection patterns CP1, CP2, CP3, and CP4 may be disposed between the light emitting elements LD1 and LD2 and the contact electrodes CTE1, CTE2, and CTE3 in a plan view. The contact electrodes CTE1, CTE2, and CTE3 may be disposed so as not to overlap the light emitting elements LD1 and LD2 in a plan view, but are not limited thereto.

One end of the connection patterns CP1, CP2, CP3, and CP4 may be electrically connected to the light emitting elements LD1 and LD2, and another end of the connection patterns CP1, CP2, CP3, and CP4 may be electrically connected to the contact electrodes CTE1, CTE2, and CTE3.

For example, the one end of the first connection pattern CP1 may contact the first end portion of the first light emitting element LD1, and the other end of the first connection pattern CP1 may contact an end of the first contact electrode CTE1.

The one end of the second connection pattern CP2 may contact the second end portion of the first light emitting element LD1, and the other end of the second connection pattern CP2 may contact one end of the second contact electrode CTE2.

The one end of the third connection pattern CP3 may contact another end of the second contact electrode CTE2, and the other end of the third connection pattern CP3 may contact the first end portion of the second light emitting element LD2.

The one end of the fourth connection pattern CP4 may contact the second end portion of the second light emitting element LD2, and the other end of the fourth connection pattern CP4 may contact an end of the third contact electrode CTE3.

The first contact electrode CTE1 may electrically connect the first connection pattern CP1 and the first alignment electrode RFE1 to each other. The first contact electrode CTE1 may contact the first connection pattern CP1 and the first alignment electrode RFE1.

The second contact electrode CTE2 may electrically connect the second connection pattern CP2 and the third connection pattern CP3 to each other. The second contact electrode CTE2 may contact the second connection pattern CP2 and the third connection pattern CP3.

The third contact electrode CTE3 may electrically connect the fourth connection pattern CP4 and the third alignment electrode RFE3. The third contact electrode CTE3 may contact the fourth connection pattern CP4 and the third alignment electrode RFE3.

In the figures, a case in which the connection patterns CP1, CP2, CP3, and CP4 contact the contact electrodes CTE1, CTE2, and CTE3 is illustrated. However, according to an embodiment, the connection patterns CP1, CP2, CP3, and CP4 may contact the alignment electrodes RFE1, RFE2, and RFE3.

The connection patterns CP1, CP2, CP3, and CP4 may be formed of a conductive material having a relatively low melting point. The melting point of the connection patterns CP1, CP2, CP3, and CP4 may be lower than a melting point of the contact electrodes CTE1, CTE2, and CTE3 and/or a melting point of the alignment electrodes RFE1, RFE2, and RFE3. For example, the melting point of the connection patterns CP1, CP2, CP3, and CP4 may be about 300° C. to 1500° C. In an embodiment, the connection patterns CP1, CP2, CP3, and CP4 may include at least one material among Pb, Zn, Te, Sb, Np, Pu, Mg, Al, Ra, Ba, Sr, Ce, As, Eu, Yb, Ca, ES, Cf, La, Pr, Pm, Ge, Bk, Am, Nd, Ac, and Au, but are not necessarily limited thereto.

In an embodiment, the connection patterns CP1, CP2, CP3, and CP4 are formed of a conductive material having a relatively low melting point, such that when overload occurs in some light emitting elements LD1 and LD2, the connection patterns CP1, CP2, CP3, and CP4 may be disconnected by heat. Therefore, even though the overload occurs in some light emitting elements LD1 and LD2, heat generation and a fire accident of the display device may be prevented or substantially prevented.

In an embodiment, the connection patterns CP1, CP2, CP3, and CP4 may be formed of the same material, but are not necessarily limited thereto.

According to an embodiment, some of the connection patterns CP1, CP2, CP3, and CP4 may be omitted. For example, one of the first connection pattern CP1 and the second connection pattern CP2 connected to the first light emitting element LD1 may be omitted, and one of the third connection pattern CP3 and the fourth connection pattern CP4 connected to the second light emitting element LD2 may be omitted.

Figure 12:
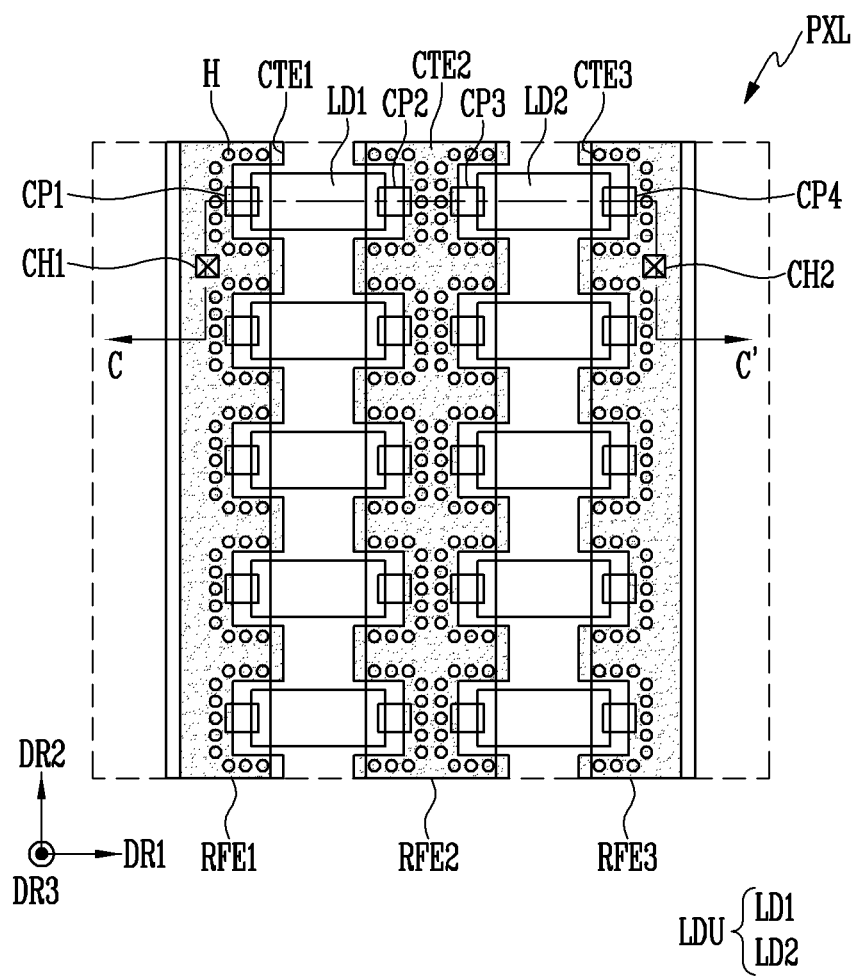
FIG. 12 is a plan view of a pixel according to another embodiment.
Figure 13:
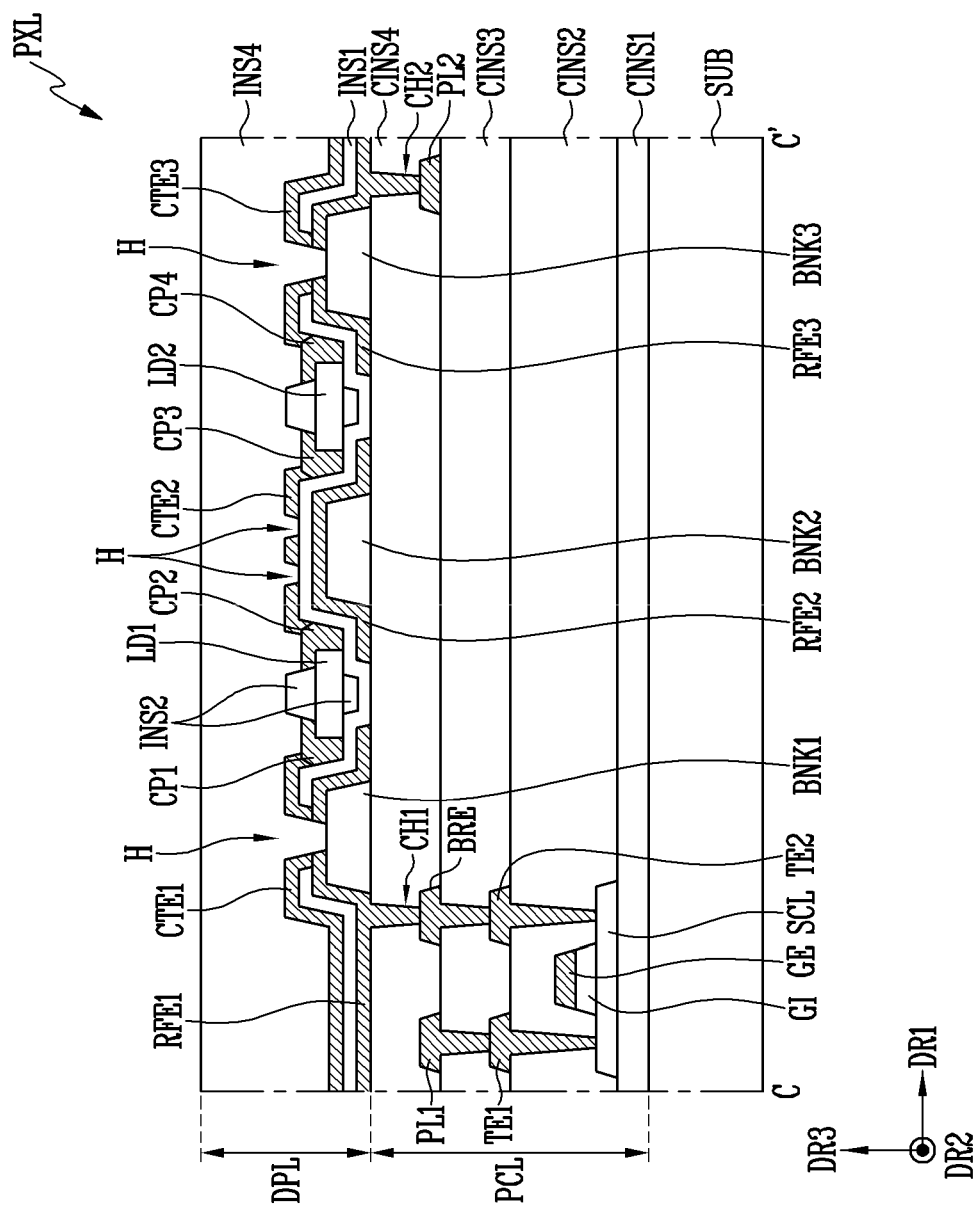
FIG. 13 is a cross-sectional view taken along the line C-C' of FIG. 12.

FIG. 12 is a plan view of the pixel according to another embodiment; and FIG. 13 is a cross-sectional view taken along the line C-C' of FIG. 12.

Referring to FIGS. 12 and 13, a display device according to another embodiment is different from the embodiment of FIGS. 10 and 11 in that the first contact electrode CTE1, the second contact electrode CTE2, and/or the third contact electrode CTE3 includes a plurality of holes H.

In an embodiment, the plurality of holes H may pass through the first contact electrode CTE1, the second contact electrode CTE2, and/or the third contact electrode CTE3. Since the plurality of holes H have been described with reference to FIGS. 1 to 9, repetitive description will be omitted.

The first contact electrode CTE1 and the first light emitting element LD1 may be electrically connected to each other by the first connection pattern CP1. The first light emitting element LD1 and the second contact electrode CTE2 may be electrically connected to each other by the second connection pattern CP2. The second contact electrode CTE2 and the second light emitting element LD2 may be electrically connected to each other by the third connection pattern CP3. The second light emitting element LD2 and the third contact electrode CTE3 may be electrically connected to each other by the fourth connection pattern CP4. Since the connection patterns CP1, CP2, CP3, and CP4 have been described with reference to FIGS. 10 and 11, repetitive description is omitted.

According to the present embodiment, when a short circuit failure occurs in some light emitting elements LD1 and LD2, the area between the plurality of holes H formed along the end portion of the corresponding light emitting element may be disconnected. Therefore, even though the short circuit failure occurs, since other light emitting elements may normally operate, a lighting failure of the light emitting element may be minimized or reduced as described above.

In addition, since the contact electrodes CTE1, CTE2, and CTE3 and the light emitting elements LD1 and LD2 are connected to each other by the connection patterns CP1, CP2, CP3, and CP4 having the relatively low melting point, when overload occurs in the light emitting elements LD1 and LD2, the connection patterns CP1, CP2, CP3, and CP4 may be disconnected by heat. Therefore, even though the overload occurs in some light emitting elements LD1 and LD2, heat generation and a fire accident of the display device may be prevented or substantially prevented as described above.

Figure 14:
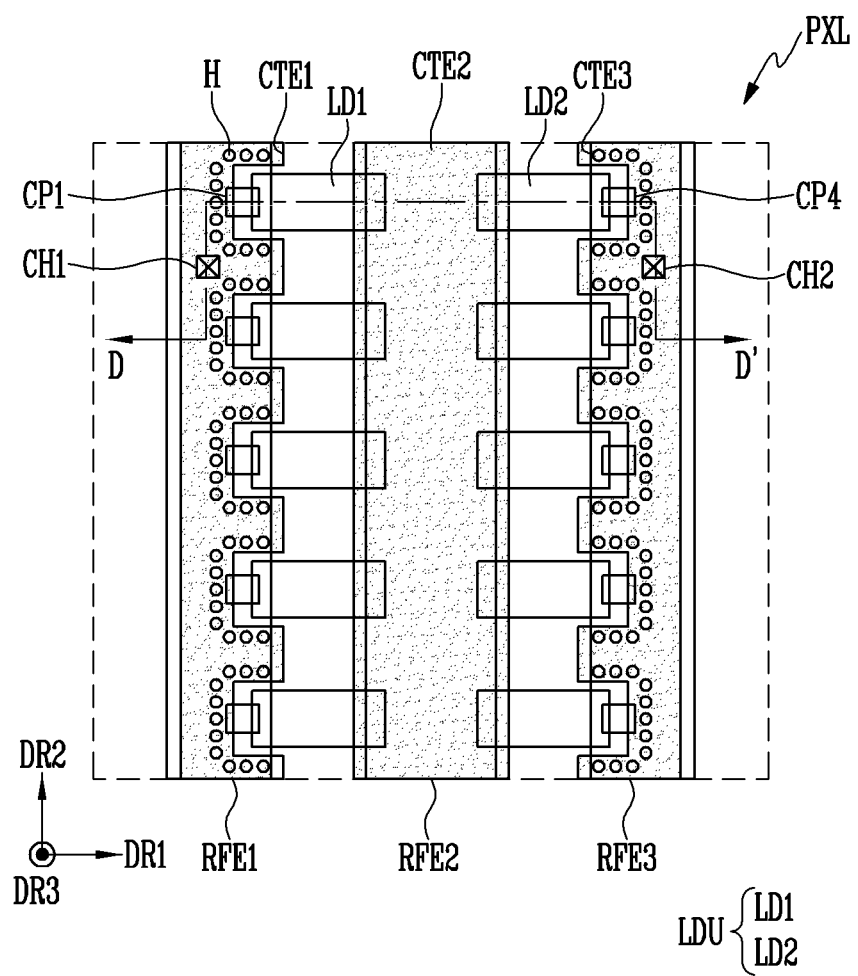
FIG. 14 is a plan view of a pixel according to another embodiment.
Figure 15:
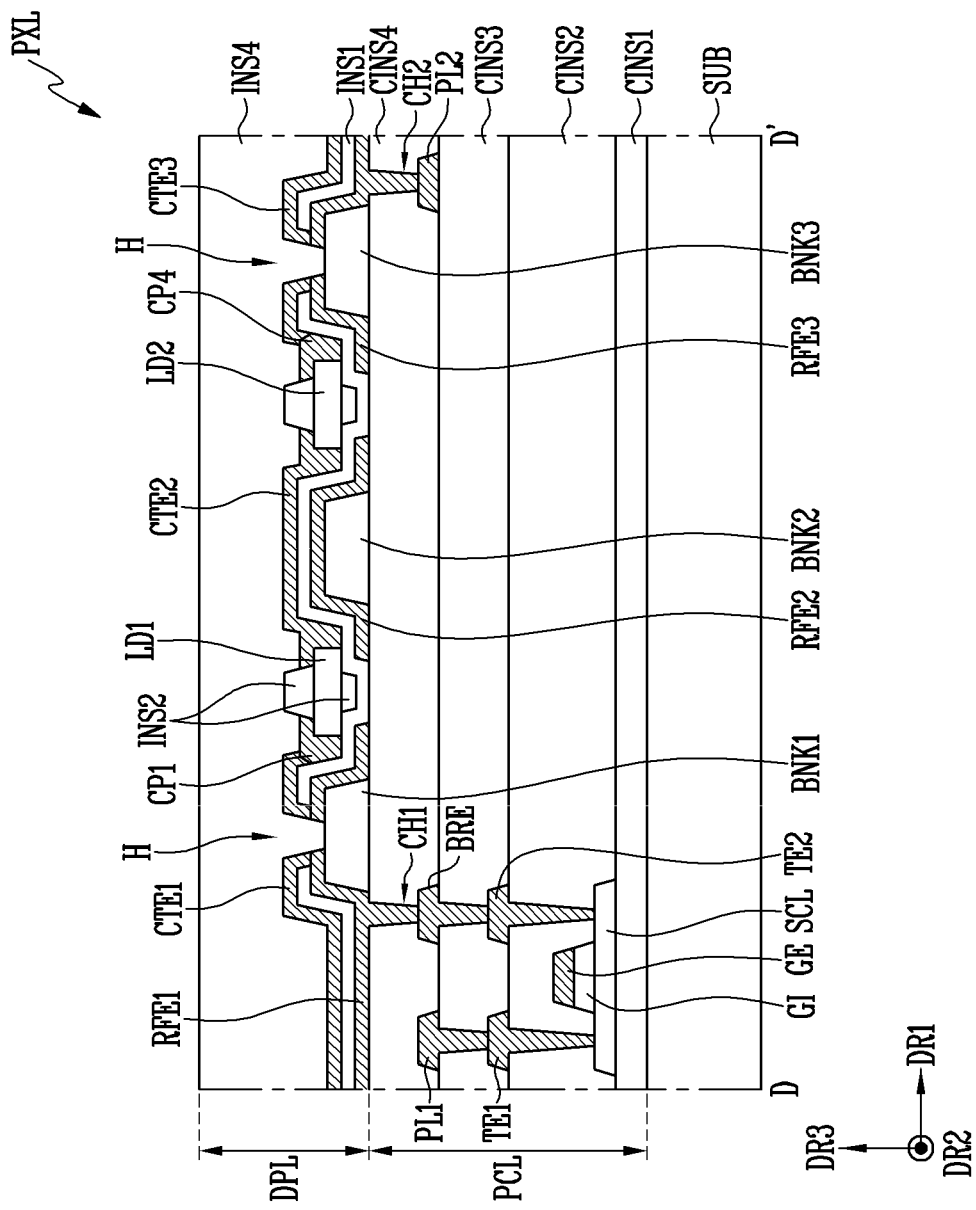
FIG. 15 is a cross-sectional view taken along the line D-D' of FIG. 14.

FIG. 14 is a plan view of the pixel according to another embodiment; and FIG. 15 is a cross-sectional view taken along the line D-D' of FIG. 14.

Referring to FIGS. 14 and 15, a display device according to another embodiment is different from the embodiment of FIGS. 10 and 11 in that the first contact electrode CTE1 and/or the third contact electrode CTE3 includes a plurality of holes H, and the second contact electrode CTE2 is directly connected to the light emitting elements LD1 and LD2.

In an embodiment, the plurality of holes H may pass through the first contact electrode CTE1 and/or the third contact electrode CTE3. Since the plurality of holes H have been described with reference to FIGS. 1 to 9, repetitive description is omitted.

The first contact electrode CTE1 and the first light emitting element LD1 may be electrically connected to each other by the first connection pattern CP1. The first light emitting element LD1 and the second contact electrode CTE2 may be directly and electrically connected to each other. The first end portion of the first light emitting element LD1 may contact the first connection pattern CP1, and the second end portion of the first light emitting element LD1 may contact the second contact electrode CTE2. In an embodiment, the second contact electrode CTE2 may directly cover the second end portion of the first light emitting element LD1.

The second contact electrode CTE2 and the second light emitting element LD2 may be directly and electrically connected to each other. The second light emitting element LD2 and the third contact electrode CTE3 may be electrically connected to each other by the fourth connection pattern CP4. The first end portion of the second light emitting element LD2 may contact the fourth connection pattern CP4, and the second end portion of the second light emitting element LD2 may contact the second contact electrode CTE2. In an embodiment, the second contact electrode CTE2 may directly cover the second end portion of the second light emitting element LD2.

In addition, since the connection patterns CP1 and CP4 have been described with reference to FIGS. 10 and 11, repetitive description is omitted.

According to the present embodiment, when a short circuit failure occurs in some light emitting elements LD1 and LD2, the area between the plurality of holes H formed along the end portion of the light emitting element may be disconnected. Therefore, even though the short circuit failure occurs, since other light emitting elements may normally operate, a lighting failure of the light emitting element may be minimized or reduced as described above.

In addition, since the contact electrodes CTE1 and CTE3 and the light emitting elements LD1 and LD2 are connected by the connection patterns CP1 and CP4 having the relatively low melting point, when overload occurs in some light emitting elements LD1 and LD2, the connection patterns CP1 and CP4 may be disconnected by heat. Therefore, even though the overload occurs in some light emitting elements LD1 and LD2, heat generation and a fire accident of the display device may be prevented or substantially prevented as described above.

Although some embodiments of the disclosure have been described with reference to the accompanying drawings, it will be understood by those skilled in the art to which the disclosure pertains that the embodiments may be implemented in other specific forms without changing the technical spirit and essential features of the disclosure. Therefore, it should be understood that the embodiments described above are illustrative and are not restrictive in all aspects.

What is claimed is:

1. A display device comprising:
a plurality of pixels on a substrate,
wherein each of the pixels comprises:
a first electrode and a second electrode spaced apart from each other on an upper surface of the substrate; and
a plurality of light emitting elements, each comprising a first end portion connected to the first electrode and a second end portion connected to the second electrode, and
the first electrode comprises a plurality of first holes adjacent to the first end portion of each of the light emitting elements and extending through an upper surface of the first electrode.

2. The display device according to claim 1, wherein first holes of the plurality of first holes are arranged along an outer edge of the first end portion of a light emitting element of the plurality of light emitting elements.

3. The display device according to claim 1, wherein the first electrode comprises a first alignment electrode and a first contact electrode on the first alignment electrode, and
the first contact electrode covers the first end portion of a light emitting element of the plurality of light emitting elements.

4. The display device according to claim 3, wherein first holes of the plurality of first holes pass through the first alignment electrode and the first contact electrode.

5. The display device according to claim 3, further comprising an insulating layer between the first alignment electrode and the first contact electrode.

6. The display device according to claim 1, wherein the second electrode comprises a plurality of second holes adjacent to the second end portion of each of the light emitting elements.

7. The display device according to claim 6, wherein second holes of the plurality of second holes are arranged along an outer edge of the second end portion of a light emitting element of the plurality of light emitting elements.

8. The display device according to claim 6, wherein an area of the first holes and an area of the second holes are the same.

9. A display device comprising:
a plurality of pixels on a substrate,
wherein each of the pixels comprises:
a first electrode and a second electrode spaced apart from each other on the substrate; and
a plurality of light emitting elements, each comprising a first end portion connected to the first electrode and a second end portion connected to the second electrode, and
the first electrode comprises a plurality of first holes adjacent to the first end portion of each of the light emitting elements,
wherein first holes of the plurality of first holes are arranged along an outer edge of the first end portion of a light emitting element of the plurality of light emitting elements,
the display device further comprising:
a bank between the substrate and the first electrode,
wherein the first holes pass through the first electrode to expose an upper surface of the bank.

10. The display device according to claim 9, further comprising an insulating layer on the first electrode,
wherein the insulating layer is connected to the upper surface of the bank through the first holes.

11. A display device comprising:
a plurality of pixels on a substrate,
wherein each of the pixels comprises:
a first electrode and a second electrode spaced apart from each other on the substrate;
a plurality of light emitting elements between the first electrode and the second electrode; and
a first connection pattern electrically connecting the first electrode and a light emitting element of the plurality of light emitting elements to each other,
wherein a melting point of the first connection pattern is lower than a melting point of the first electrode,
the first electrode comprises a first alignment electrode and a first contact electrode on the first alignment electrode, and
an end of the first connection pattern is in contact with the first contact electrode, and another end of the first connection pattern is in contact with a first end portion of the light emitting element.

12. The display device according to claim 11, wherein the first electrode and the light emitting element are spaced apart from each other.

13. The display device according to claim 11, wherein the second electrode is in contact with a second end portion of the light emitting element.

14. The display device according to claim 11, further comprising a second connection pattern connecting the second electrode and the light emitting element to each other.

15. The display device according to claim 14, wherein the first end portion of the light emitting element is connected to the first connection pattern, and a second end portion of the light emitting element is connected to the second connection pattern.

16. The display device according to claim 14, wherein the second electrode and the light emitting element are spaced apart from each other.

17. The display device according to claim 14, wherein a melting point of the second connection pattern is lower than a melting point of the second electrode.

18. The display device according to claim 14, wherein the first connection pattern and the second connection pattern are formed of a same material.

* * * * *